United States Patent [19]

Suptitz et al.

[11] Patent Number: 5,150,057
[45] Date of Patent: Sep. 22, 1992

[54] CONTINUOUS MONITORING SYSTEM OF THE ELECTRICAL CONDUCTION OF A MAINS SYSTEM

[75] Inventors: Eric Suptitz, Grenoble; Joseph Diaferia, St. Martin d'Heres, both of France

[73] Assignee: Merlin Gerin, Meylan, France

[21] Appl. No.: 612,860

[22] Filed: Nov. 14, 1990

[30] Foreign Application Priority Data

Nov. 24, 1989 [FR] France ................ 89 15689

[51] Int. Cl.⁵ ............... G01R 31/02; G01R 31/08
[52] U.S. Cl. ........................ 324/508; 324/525; 340/600
[58] Field of Search ............ 324/508, 525, 691; 340/660, 661; 361/86, 87, 88

[56] References Cited

U.S. PATENT DOCUMENTS 4,400,663 8/1983 May .................... 324/525

FOREIGN PATENT DOCUMENTS 1137509 10/1962 Fed. Rep. of Germany .

Primary Examiner—Edward L. Coles, Sr.
Assistant Examiner—R. Bacares
Attorney, Agent, or Firm—Parkhurst, Wendel & Rossi

[57] ABSTRACT

The monitoring system of the conduction of a low voltage A.C. mains system comprises at least one measuring module creating a D.C. current component between two mains system conductors. The measuring module computes a value representative of the line resistance of the mains system which is proportional to the ratio between the measurement of the D.C. component of the voltage at its terminals and the measurement of the D.C. component of a voltage at the terminals of a resistor through which the D.C. current flows. An increase in this measured value indicates a loss of conduction and, therefore, such an increase is detected and indicated as soon as it exceeds a preset thereshold. A servo module delimits, may also be provided for delimiting the portion of the mains system to be monitored enabling looping of the D.C. current component and regulating the D.C. component of the voltage at its terminals to zero.

10 Claims, 10 Drawing Sheets

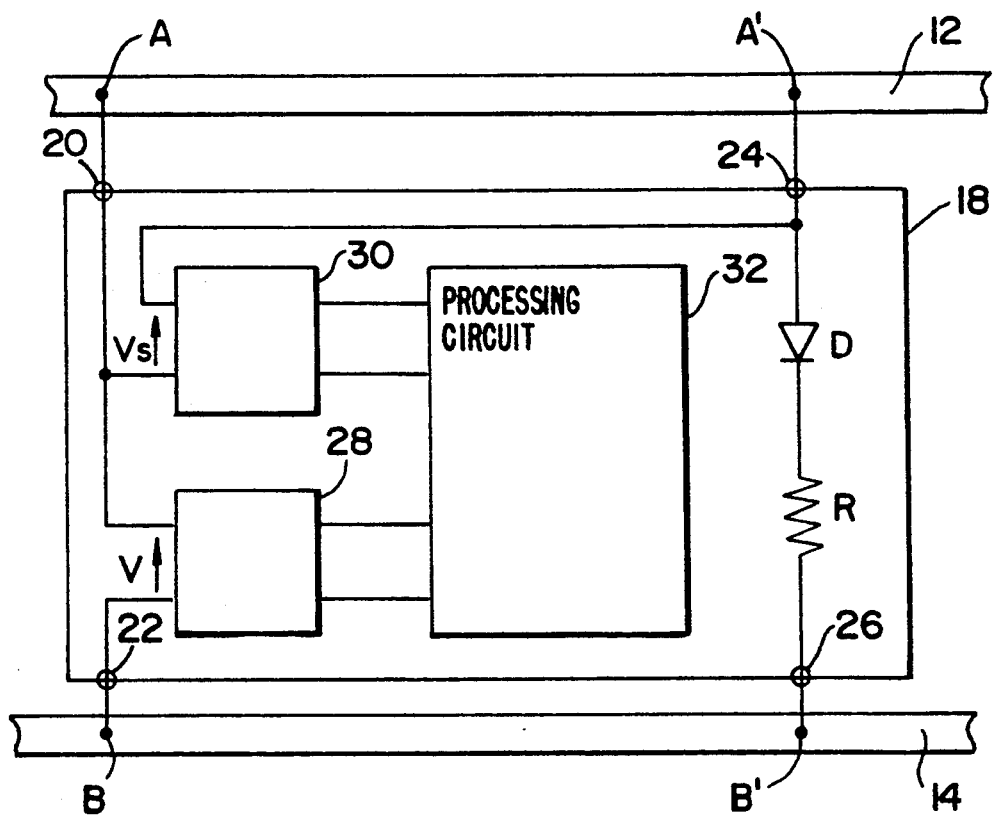
Fig_ 6
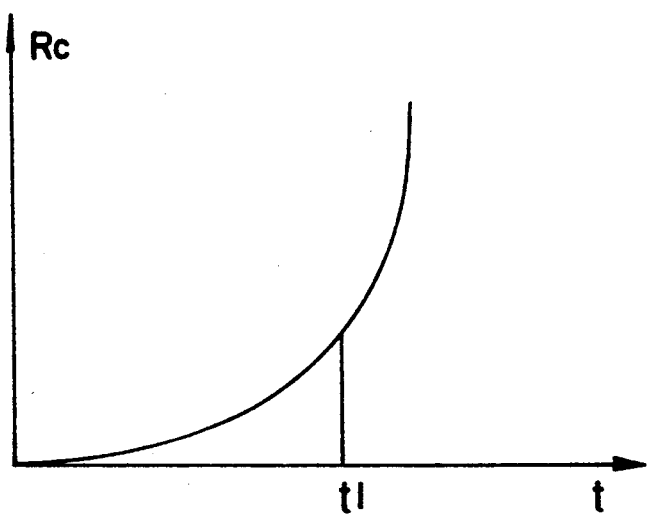
Fig_ 8

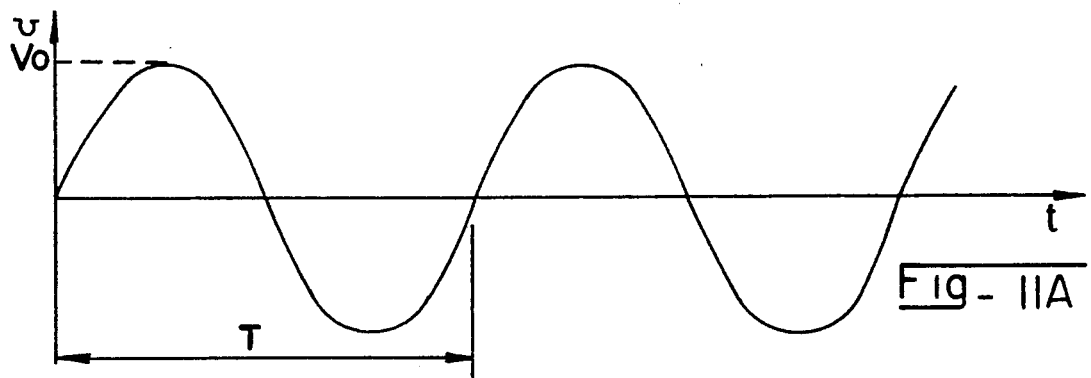
Fig - 11A
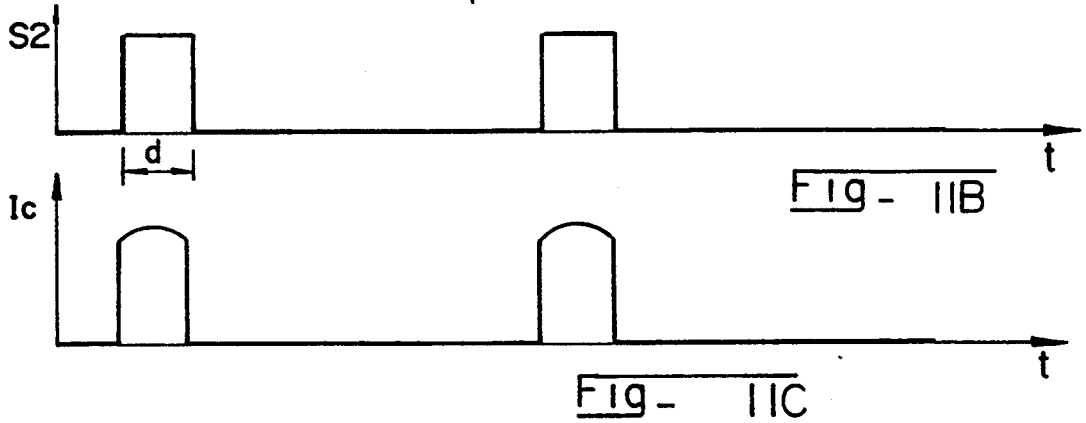
Fig - 11B
Fig - 11C
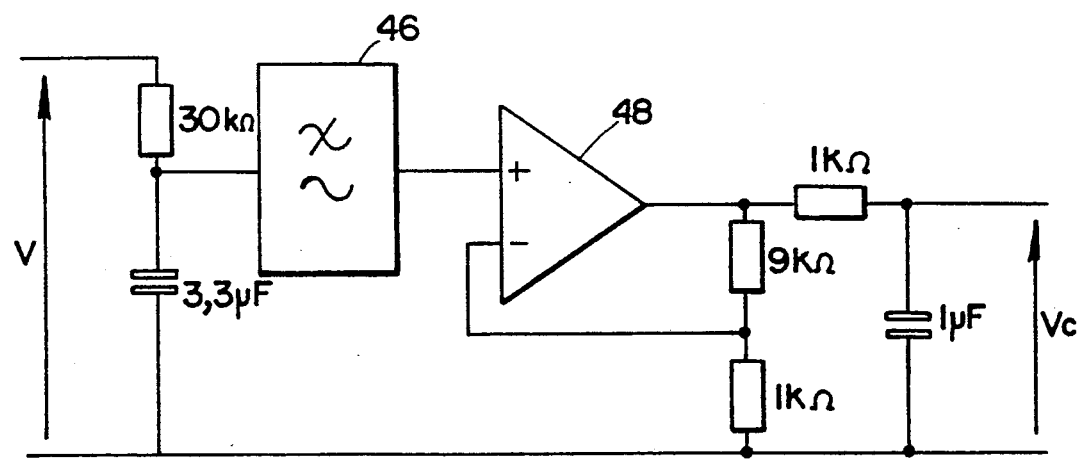
Fig - 12

CONTINUOUS MONITORING SYSTEM OF THE ELECTRICAL CONDUCTION OF A MAINS SYSTEM

BACKGROUND OF THE INVENTION

The invention relates to a continuous monitoring system of the electrical conduction of a mains system comprising first and second conductors fed by an A.C. voltage source.

In an electrical mains system, the problems of bad conduction are linked either to faulty connections, for example the connections of the bars of a low voltage switchboard, or to faulty contacts of switchgear inserted in the mains system, for example circuit breaker contacts. Loosening of a connection leads to local overheating which may be responsible for damage to nearby equipment and may cause fires.

It has been proposed to monitor certain contacts by means enabling local overheating to be detected. According to a first monitoring procedure, the contact temperature is measured, a thermistor or a thermocouple being associated with each contact to be monitored. Such a procedure requires a large number of temperature sensors, one per contact to be monitored, each of the sensors in addition having to be connected to an information processing device, which implies a large number of wires. According to a second procedure, a camera is used to take thermographic photos to detect the hot spots on a busbar. There is naturally no way of placing a camera opposite each point to be monitored and such a procedure cannot be used for continuous monitoring, but only for the purposes of occasional maintenance.

SUMMARY OF THE INVENTION

The object of the invention is to achieve a system, which is both simple and reliable, enabling monitoring of the conduction of a mains system to be carried out continuously.

The German Patent 1,137,509 deals with a measuring device of the internal ohmic resistance of a mains system, designed to enable short-circuits to be detected. Measurement is made with the mains system powered-on by interposing a serial circuit formed by a resistor and a rectifier at measuring points of the mains system. The D.C. component of the voltage at the terminals of the measuring points is measured by means of a filter and displayed, this component being representative of the internal ohmic resistance of the mains system.

A comparable technique is used, according to the invention, to monitor the electrical conduction of a mains system.

The measuring system according to the invention comprises at least one measuring module comprising production means of a D.C current component between first and second points situated respectively on the first and second conductors, measuring means of the voltage applied between these first and second points, and extraction means of the D.C. component of said voltage. It is characterized in that it is designed to perform continuous monitoring of the electrical conduction of at least a portion of the mains system, the output of the extraction means being connected to the input of a processing and indication circuit comprising computation means of a value representative of the line resistance of a portion of the mains system, detection means of a variation of said value, comparison means of said variation with a preset threshold and indication means of a conduction fault when said variation exceeds said threshold.

According to an improvement of the invention, the possible influence of loads connected to the mains system downline from the measuring module is eliminated by the fact that the D.C. current component production means are designed to be connected between said second point and a third point of the first conductor adjacent to the first point so as to delimit between the first and third points a shunt resistor constituted by a contact-free portion of the first conductor, the measuring module comprising measuring means of the voltage at the terminals of the shunt resistor and extraction means of the D.C. component of the voltage at the terminals of the shunt resistor, the value representative of the line resistance computed by the processing circuit being proportional to the ratio of the D.C. components of the voltages measured respectively between said first and second points and at the terminals of the shunt resistor.

According to another improvement of the invention, the system comprises at least one loop module comprising input terminals designed to be connected to fourth and fifth points situated respectively on the first and second mains system conductors, said loop module comprising looping means of said D.C. current component. The loop module can be formed by a servo module comprising means of regulating the D.C. component of the voltage applied between its input terminals to zero, the line resistance computed by the measuring module processing circuit being the line resistance of the portion of the mains system comprised between the measuring and servo modules.

By placing measuring and servo modules alternately along a mains system, it is possible to monitor the conduction of all the portions of the mains system comprised between these modules, without disturbing the operation of the mains system, and to detect in which portion of the mains system the conduction fault occurred.

A system of this kind can be used without any problem even on already existing mains systems. It is in fact sufficient to connect the system modules to the mains conductors. It should be noted that the absence of additional connections between the different modules makes such a system much easier to set up.

According to a development of the invention, the production means of a D.C. current component of a measuring module comprise a controlled rectifier, whose control is connected to the output of a regulator, and the system comprises a central processing unit connected to each measuring module so as to control switching on of the controlled rectifier of the measuring module.

It is then possible to monitor a mains system comprising a plurality of branches by means of a system comprising a servo module located upline from the portion of mains system to be monitored and a measuring module connected downline from each of the terminal branches of the mains system to be monitored, the central processing unit controlling sequential triggering of the controlled rectifiers of the measuring modules and continuously receiving from the different measuring modules a value representative of the D.C. component of the voltage at the terminals of said measuring module, the central processing unit comprising computation means of the values representative of the line resistance of the various portions of mains system, detection means of a variation of said values, comparison means of said variations with preset respective thresholds, and indication means of a conduction fault in one of said portions when the variation of the value associated with said portion exceeds the corresponding threshold.

BRIEF DESCRIPTION OF THE DRAWINGS

Other advantages and features will become more clearly apparent from the following description of illustrative embodiments of the invention, given as non-restrictive examples only and represented in the accompanying drawings, in which:

FIG. 6 schematically represents an embodiment of a measuring module designed to implement the principles illustrated in FIGS. 3 and 5.

FIG. 8 illustrates the loosening curve of a contact.

FIG. 11 illustrates the wave shapes of the signals at given points of the power stage according to FIG. 10.

FIG. 12 an alternative embodiment of a filter.

Figure 17:
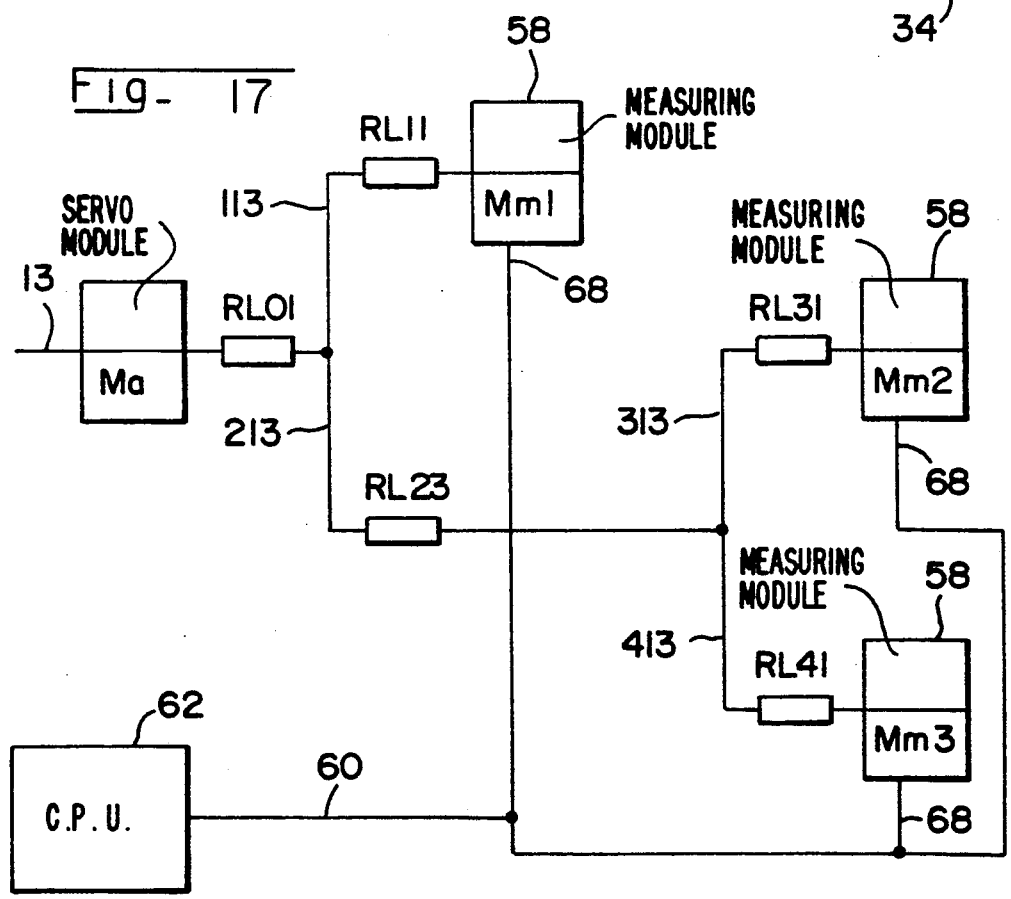
Figure 18:
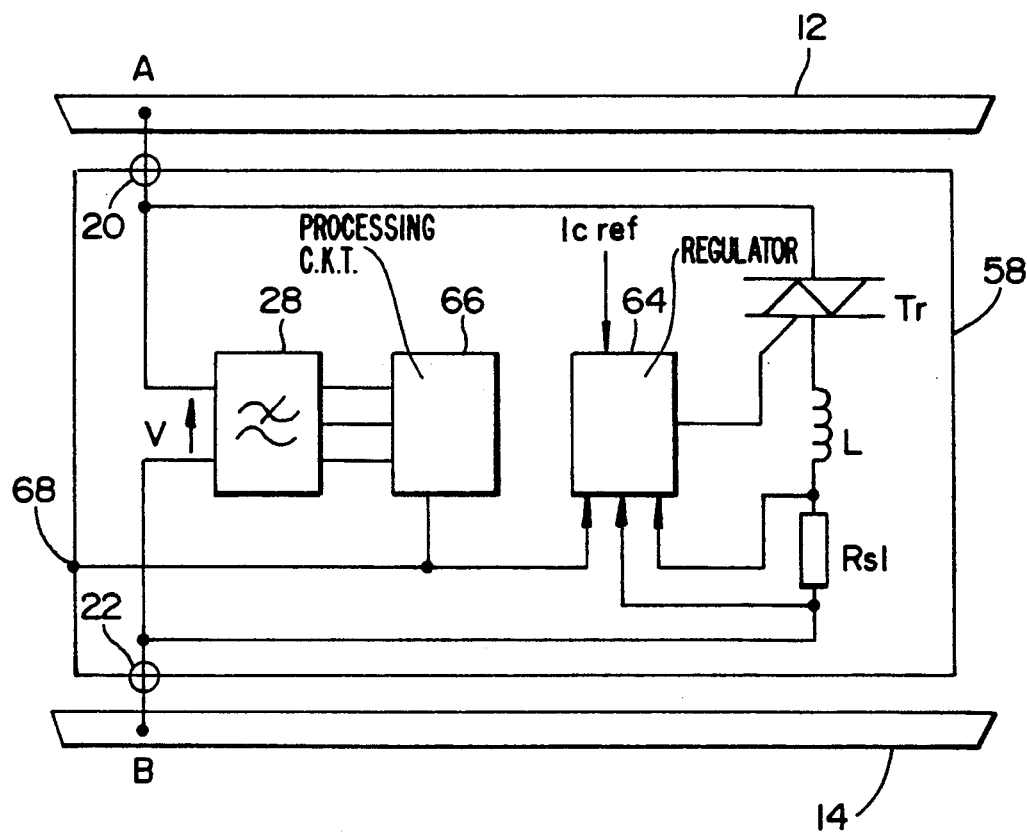

Another alternative embodiment of the invention is illustrated in FIGS. 17 and 18.

DESCRIPTION OF THE PREFERRED EMBODIMENT

Figure 1:
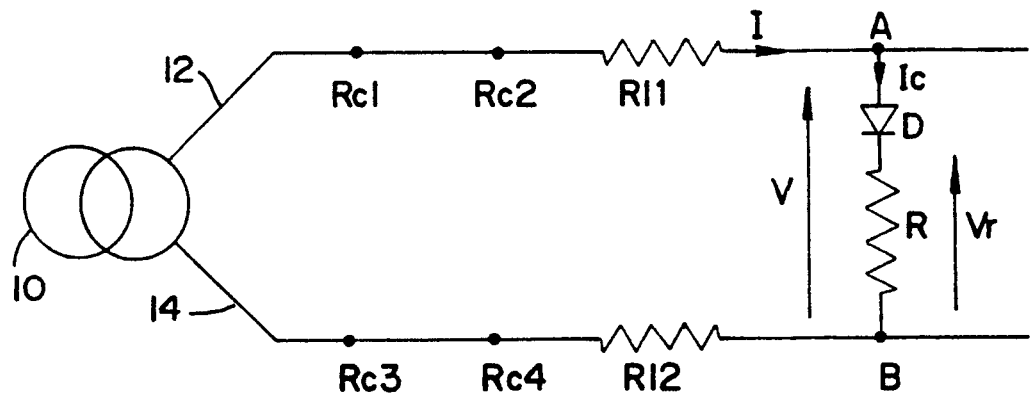
FIG. 1 schematically illustrates the measuring principle at the base of the measuring system according to the invention.

In FIG. 1 a single-phase electrical mains system, connected to the output of a low voltage transformer 10, is supplied with A.C. voltage by the transformer. Resistors R11 and R12 schematize the line resistance of each of the conducting wires 12 and 14 of the mains system, upline from points A and B situated respectively on each of the wires. Resistors Rc1 to Rc4 schematize contact resistances due to the interposition of contacts or connections on the mains system, between the transformer and the points A and B. An alternating current Ia flows through the mains system.

The line resistance RL of the mains system upline from the points A and B, constituted by the sum of the line resistances R11 and R12 and of the contact resistances Rc1 to Rc4, is representative of the conduction of the mains system upline from the points A and B.

A disturbance in the conduction of the mains system, due for example to a contact coming loose, results in fact in an increase in the line resistance RL. If the line resistance RL is continuously measured, any increase can be detected and indicated as soon as it exceeds a preset threshold considered as significant. According to a preferred embodiment, any variation in the line resistance RL greater than 0.1 milliohms is considered as abnormal and indicated to the user.

In order that the measurement of the line resistance RL is not disturbed by inductive phenomena, a direct current component Ic, for example in the order of 100 mA, is superposed on the alternating current Ia during measurement. The system according to the invention comprises a measuring module comprising production means of a direct current component. In FIG. 1, these means are schematized by the connection between terminals situated at the points A and B of a diode D in series with a dissipation resistor R. Ic being the direct current flowing in the diode D and the resistor R, the portion of the mains system situated upline from the points A and B has flowing through it a current I = Ia + Ic and the voltage V between the terminals A and B is constituted by the superposition of an A.C. component v and of a D.C. component Vc = RL.Ic. The line resistance RL can thus be obtained by making the relationship Vc/Ic between the value of the D.C. component Vc of the voltage V at the terminals A and B and the value of the D.C. component Ic of the current.

The resistance R being known, the voltage Vr = R.Ic at its terminals is representative of the D.C. component Ic of the current. Measurement of the voltages V and Vr, then extraction of their D.C. components, enables values representative of Vc and Ic to be obtained and the line resistance RL to be computed.

Figure 2:
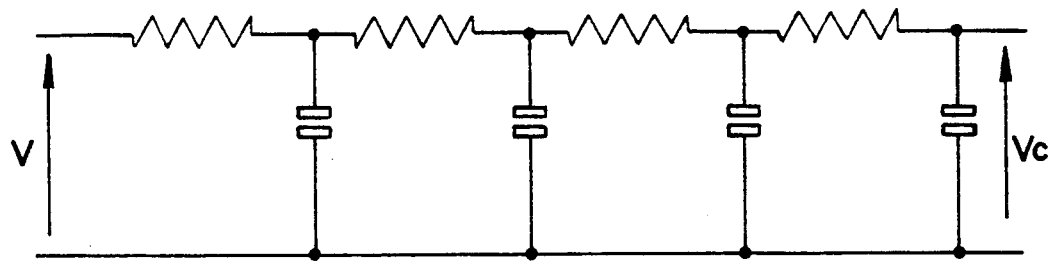
FIG. 2 represents a particular embodiment of a filter of a system according to the invention.

To extract the D.C. component Vc from the voltage V the measuring module comprises a filter to whose input the voltage signal V is applied and which supplies on output the signal Vc. Such a filter, of the low-pass type, is, in a preferred embodiment, continued by a 4th order RC type filter as represented in FIG. 2. As an example, the mains system being supplied with A.C. voltage at 50 Hz, the values of the parts making up the filter are chosen in such a way as to define a cutoff frequency of 0.5 Hz and an attenuation close to 160 dB at 50 Hz.

A measurement made in accordance with the principle illustrated in FIG. 1 can be disturbed when a load is connected to the mains system downline from the points A and B. Indeed, the resistance measured is then constituted by the line resistance RL in parallel on the load resistor. This disturbance can be ignored when the load resistance is much greater than the line resistance RL. The measurement can also be disturbed if an asymmetric load, creating an additional D.C. component is connected downline from the points A and B, the D.C. component of the current measured not corresponding, in this case, to the D.C. component of the current in the line resistance RL.

Figure 3:
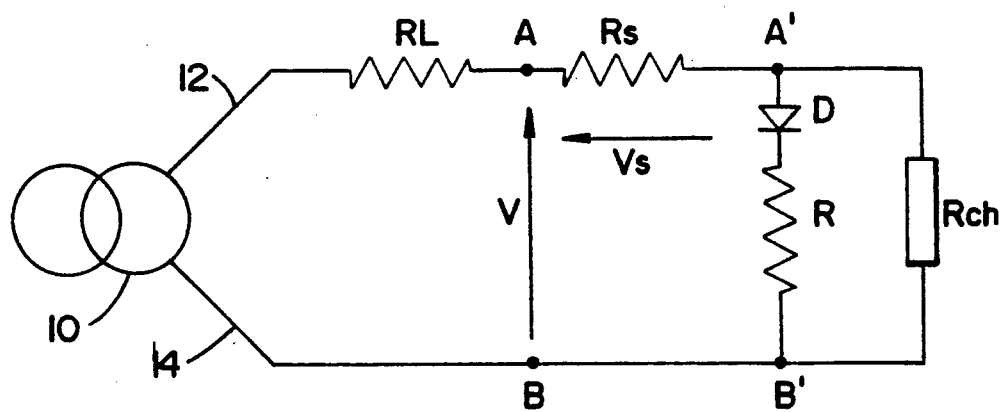
FIG. 3 schematically represents on improvement to the principle illustrated in FIG. 1.

FIG. 3 illustrates on improvement to the measuring principle according to FIG. 1, enabling the constraints linked with the possible presence, downline from points A and B, of a relatively weak load, for example constituted by the primary winding of a transformer, or of an asymmetric load, for example a single-wave rectifier, introducing an additional D.C. component, to be overcome without disconnecting the load during measurement.

According to FIG. 3, the current measurement is made on a shunt Rs' materialized by a contact-free portion of the line to be monitored. The shunt Rs schematized in the figure is constituted by the portion of line comprised between the point A of the conductor 12 and a point A' situated downline from the previous point, the diode D and the resistor R being connected in series between a terminal located at the point A' and a terminal located at a point B' of the conductor 14, the points B and B' being preferably the same. The resistance Rs of the shunt being known, the D.C. component of the voltage Vs measured between the terminals A and A' supplies a value representative of the D.C. component of the current flowing in the line resistance RL and, in combination with the D.C. component of the voltage V measured between the terminals A and B, enables a value of the line resistance RL to be obtained independent of the load. The ratio of the D.C. components of V and Vs is equal to the ratio of the line resistance RL and shunt resistance Rs. An increase in this ratio is interpreted as an increase in the line resistance.

As an example, if the measurement is made in a low voltage switchboard in which the mains system is constituted by copper conducting bars, the shunt Rs is formed by a portion of bar comprised between the terminals A and A'. For a portion of copper bar 50 mm wide and 5 mm thick, designed for a rated current of 630A to flow through, and 10 cm long, the resistance Rs is in the order of 8 microhms. Similarly, if the measurement is made in a zone where the mains system is made up of cables, the shunt is formed by a portion of cable. For a 6 sq.mm cable, the resistance Rs of a portion of cable 10 cm long is in the order of 300 microhms.

As the same current is flowing in the line resistance and the shunt Rs, any variation in the line resistance due to a temperature increase is compensated by an equivalent variation of the shunt resistance. The ratio of the D.C. components of V and Vs, equal to the ratio RL/Rs of the line and shunt resistances, remains constant whatever the temperature if a contact does not come loose. Thus, normal heating of a bar, which leads to a simultaneous increase in the line resistance and the shunt resistance, is not interpreted as loosening of a contact, only the ratio between the two resistances being taken into account.

Figure 4:
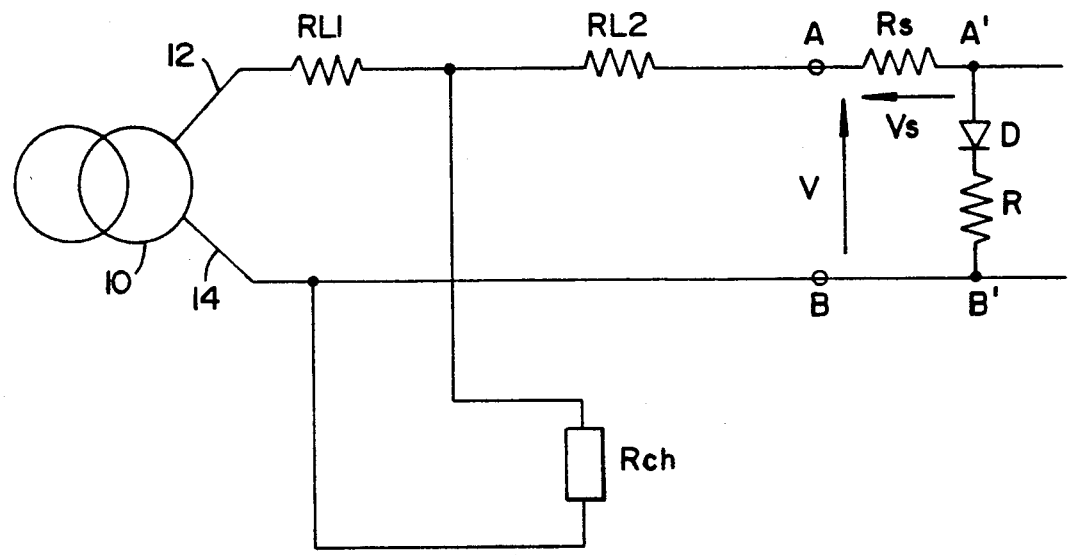
FIG. 4 represents a circuit according to FIG. 3 in which a load is connected upline from the measuring module.

When as illustrated in FIG. 4, a load Rch is connected upline from the points A and B, the line resistance RL can be divided into two partial line resistances : RL1 between the transformer 10 and the connection points of the load Rch to the mains system (12, 14) and RL2 between these connection points and the points A and B. The resistance effectively measured then corresponds to RL2+(RL1//Rch) and not to RL=RL1+RL2. An improvement of the invention enables the possible influence of loads connected upline from the points A and B to be overcome. According to this improvement, the line resistance RL measured is the resistance of a portion of line comprised between the points A and B and points A1 (on conductor 12), and B1 (on conductor 14) between which are connected means enabling the D.C. component Ic to be looped. These loop means can be constituted by a second diode connected in series with a resistor of the same value as R between the points A1 and B1, the second diode being reverse polarized with respect to the diode D.

Figure 5:
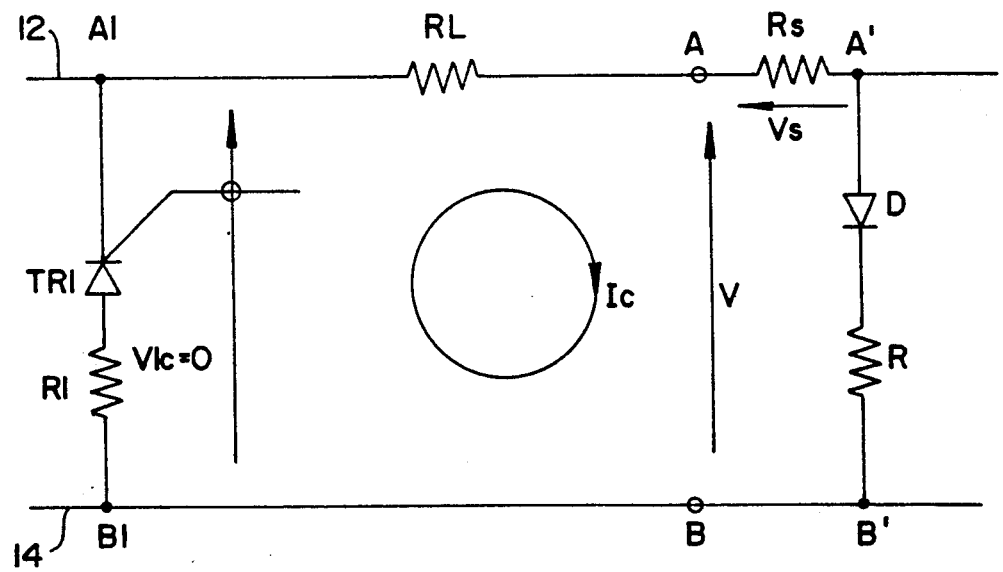
FIG. 5 schematically represents an improvement to the principle illustrated in FIG. 3.

According to a preferred embodiment illustrated in FIG. 5, the loop means are formed by a dissipation resistor Rl in series with a thyristor Th1 connected in such a way as to enable the current to pass from the conductor 14 to the conductor 12, i.e. in reverse direction from the diode D. The thyristor Th1 is controlled so as to cancel the D.C. component V1c of the voltage V1 at the terminals of the points A1 and B1. In this way, the ratio Vc/Ic effectively provides the line resistance of the portion of line comprised between points A and B and points A1 and B1, without being affected by the loads that may be connected downline or upline from this portion of line.

If we want the result of the measurement to be uninfluenced by the loads that may be connected upline, the loads connected downline being sufficiently high to be ignored, the same direct current looping procedure can also be applied to a system using the measuring principle according to FIG. 1. The line resistance of a portion of mains system comprised between points A and B and points A1 and B1 is then measured, for example by regulating the D.C. component V1c to zero and measuring the D.C. components of the voltages V and Vr. When an accurate measurement is not necessary it can be considered, as a first approximation, that the direct current Ic is constant (for example 100 milliamps) and that the D.C. component Vc is representative of the line resistance. Any variation in the line resistance results in a proportional variation of the D.C. component Vc. Only the variations of this component are monitored and any variation greater than a preset threshold, for example 10 microvolts, is indicated. The measuring module is then very simple.

A measuring system using the principle illustrated in FIG. 5 comprises at least one measuring module, connected to the points A, A', B and if applicable. B' of the mains system, and a servo module connected to the points A1 and B1.

The mains system is therefore segmented into portions (A-A1, B-B1) of line whose ends are connected respectively to a measuring module and to a servo module, so as to monitor the line resistance of this portion of line. The segmentation of the mains system enables the conduction to be monitored over the whole mains system and enables a conduction fault to be easily located. For the system to keep a good sensitivity, it is advisable to limit the portion of line monitored situated between the measuring and servo modules. In fact the line resistance RL measured is made up of the sum of the line resistances of the bars or cables and of the contact resistances of the interposed connections on the portion of line to be monitored. To detect loosening of a contact, i.e. an increase in the contact resistance, the ratio between the line resistance of the bars, or cables, and the contact resistance must be reasonable. As an example, if the portion of line to be monitored is made up of a 50×5 bar, having a resistance of 0.075 milliohms/m, and the system has to detect a contact resistance of 0.1 milliohms constituting 5% of the resistance of the bar, the length of bar that can be monitored is 27 metres.

The measuring module 18 according to FIG. 6 comprises terminals 20, 22, 24 and 26 designed to be connected respectively to points A, B, A' and B' of the mains system. The distance separating the points A and A' is determined in terms of the type of mains system, for example 10 cm in the case of a 50×5 bar. The terminals 24 and 26 are connected by the diode D in series with the resistor R. The terminals 20 and 22 are connected to the inputs of a first low-pass filter 28, for example of the type represented in FIG. 2.,The terminals 20 and 24 are connected to the inputs of a second low-pass filter 30, of the same type as the previous one. The output signals from the filters 28 and 30, respectively representing the D.C. components of the voltages V and Vs, are applied to the inputs of an electronic processing and signalling circuit 32.

The circuit 32 computes the value of the line resistance of the portion of the mains system to be monitored, the line resistance being equal to the product of the shunt resistance Rs by the ratio of the D.C. components Vc and (Vs)c of the voltages V and Vs. The value of Rs can be predetermined, tables indicating the corresponding values of the distance AA' to be respected depending on the type of conductor making up the line 12. According to an alternative embodiment, the circuit 32 can contain input means of the value Rs, for example a potentiometer or a switch.

Figure 7:
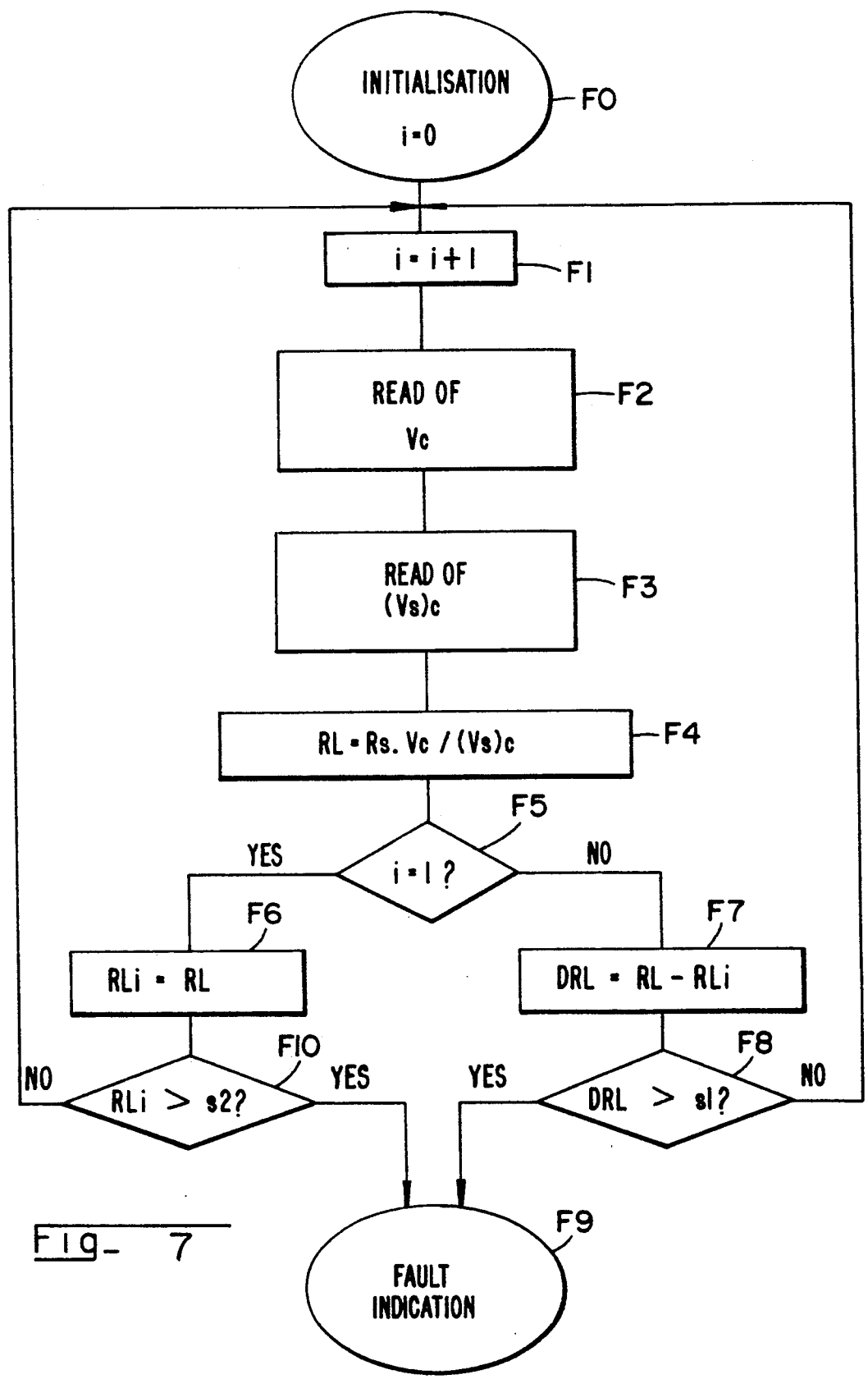
FIG. 7 represents the operation flow chart of a processing circuit of a measuring module according to FIG. 6.

The circuit 32 monitors the variations of the line resistance. According to a particular embodiment illustrated in FIG. 7, the circuit 32 comprises a microprocessor connected to at least one ROM. When the module is connected to the mains system to be monitored, the microprocessor, after an initialization phase (F0), during which the contents i of a register are set to 0, increments (F1) the value i, then reads (F2, F3) the values Vc and (Vs)c and computes (F4) the line resistance RL. When the first value computed is involved (F5 : i=1), this initial value RLi is memorized (F6). Otherwise, the microprocessor computes (F7) the difference DRL between the last line resistance computed RL and the initial line resistance RLi. This difference is compared (F8) to a preset threshold s1, for example 0.1 milliohms, and when the difference is greater than this threshold, the microprocessor sends a fault indication order (F9). If the difference DRL is lower than this threshold s1, a new measuring cycle begins. The module thus continuously monitors the line resistance and indicates any increase in this resistance greater than a preset threshold s1.

By monitoring the increase in the line resistance only, it is possible to monitor portions of line of various sizes. In the description above, the portion of mains system to be monitored is supposed not to comprise loose contacts when the measuring device is connected to the mains system. In practice, this procedure is also applicable when a contact is partially loose on connection. In fact, the loosening curve varies in a substantially exponential manner with time, the contact resistance Rc of a loose contact first increasing slowly, then very quickly as shown in FIG. 8. As an example, if the connection is made at time t1, the increase in the contact resistance is such that it can be detected in a few measuring cycles of the microprocessor.

The initial value RLi may (F10) be compared to a threshold s2 before the microprocessor begins a second measuring cycle, the threshold s2 being sufficiently high to be representative of a bad contact for all the line resistances liable to be measured by the device. If the value RLi is greater than the threshold s2, the microprocessor sends a fault indication order (F9), if not a new measuring cycle is performed.

Figure 9:
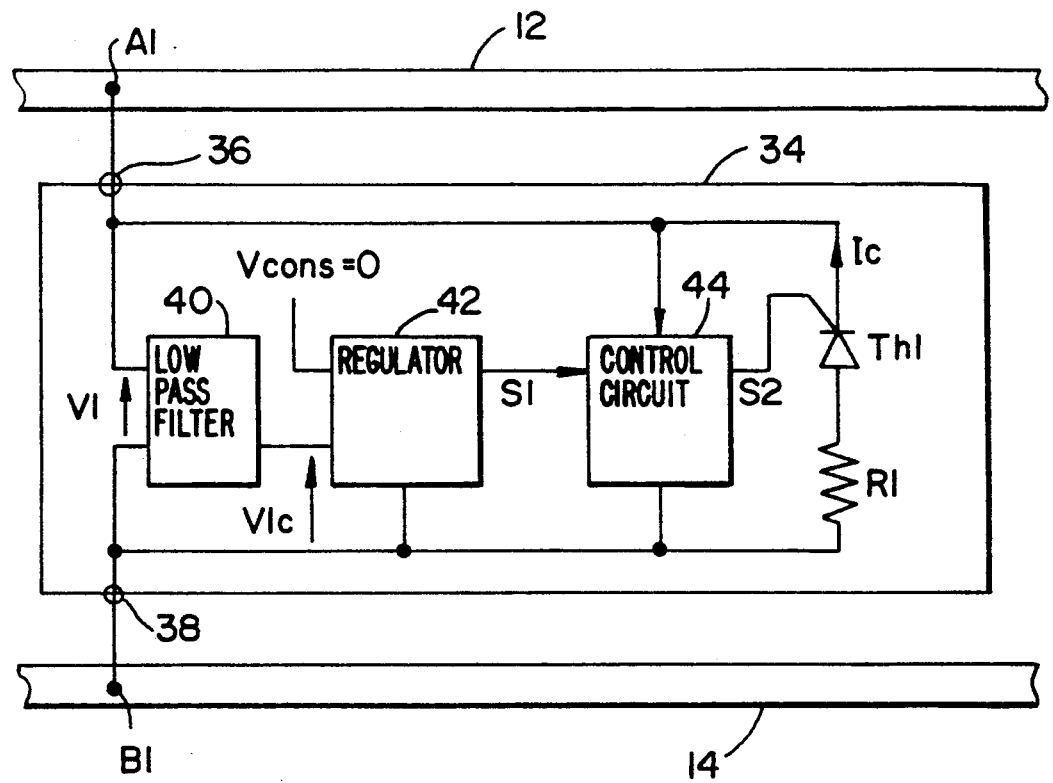
FIG. 9 represents, in block diagram form, an embodiment of a servo module.

The servo module 34 according to FIG. 9 comprises two input terminals 36 and 38, designed to be connected respectively to points A1 and B1 delimiting an end of the portion of line (12, 14) to be monitored.

The terminals 36 and 38 of the servo module 34 are connected to the inputs of a low-pass filter 40, which may be of the type represented in FIG. 2. The output signal of the filter 40 is representative of the D.C. component V1c of the voltage V1 between the points A1 and B1. The D.C. component V1c is regulated to zero in the servo module 34. The D.C. component V1c and a zero setpoint voltage Vcons are applied to the input of a regulator 42, which may be a conventional regulator of the PID (Proportional-integrator-derivative) type. The output voltage signal S1 from the regulator 42 is applied to the input of a control circuit 44 whose output signals S2 are applied to the control input of a power stage formed by the circuit (R1, Th1) designed to loop the D.C. component Ic. In FIG. 9, the signals S2 are applied to the gate of the thyristor Th1, the control circuit 44 producing pulses S2, synchronized on the frequency of the A.C. voltage applied to the mains system 12, 14 to be monitored and whose duration, determining the thyristor firing lag angle, is a predetermined function of the output voltage S1 of the regulator 42. To achieve synchronization of the pulses S2 on the mains system frequency, a control circuit input is connected to the terminal 36.

Figure 10:
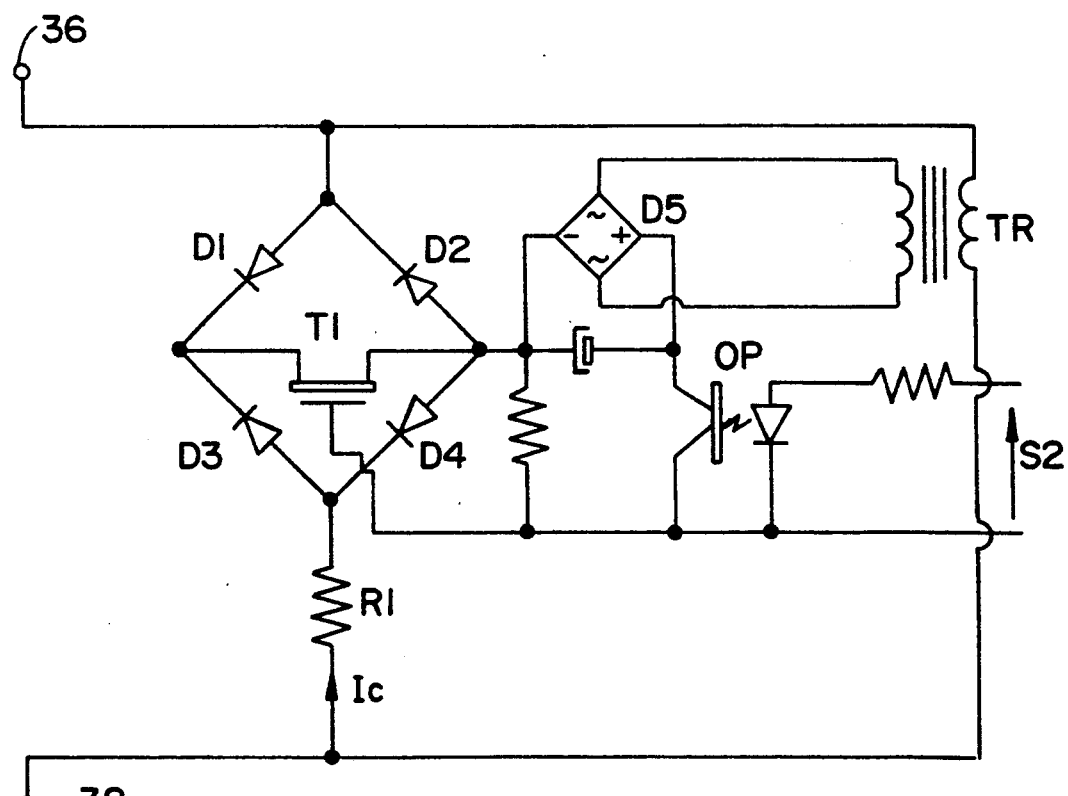
FIG. 10 represents an alternative embodiment of the power stage of a module.

FIG. 10 represents an alternative embodiment of the power stage of the servo module 34. A diode bridge, D1 to D4, is connected in series with the resistor R1 between the terminals 36 and 38 of the module. A transistor T1, of the MOSFET type, is connected between the D.C. output terminals of the diode bridge.

The output S2 of the control circuit is applied to the base of the transistor T1 by means of an optocoupler OP. A transformer TR, whose primary winding is connected to the terminals 36 and 38 and whose secondary winding is connected to a diode bridge D5, supplies the receiver part of the optocoupler OP.

With pulses S2, of duration d, represented in FIG. 11, the current Ic in the transistor T1 and the resistor R1 is of the shape represented in FIG. 11 and the mean value of the current is given by : Ic = Vo/$\pi$R1 $\times$ sin $\pi$.d/T, where T and Vo are respectively the period and the peak voltage of the AC voltage v applied to the mains system to be monitored, and where d is the duration of a pulse S2. If the control circuit 44 is designed in such a way that the predetermined function linking the duration d of a pulse S2 to the output voltage S1 of the regulator is a function of the type Arc sin (S1), the mean value of the current Ic is proportional to S1.

Other embodiments of the power stage can be envisaged. In particular, to eliminate the dissipation resistor R1, the use of a non-dissipative circuit (LC) tuned to the mains system frequency can be envisaged.

According to another alternative embodiment, the power stage is formed by an inductance connected in series with a triac between the terminals A1 and B1, thus forming a non-dissipative circuit. The triac is, like the thyristor Th1 according to FIG. 9, controlled by output signals S2 from the control circuit 44. In such an embodiment, the inductance can be weak, for example in the order of a millihenry for a mean current in the order of 1A through the triac.

In order to ensure an optimum regulation regardless of the variations of the mains system impedance, the regulator 42 can be an adoptive regulator. According to a particular embodiment, the low-pass filters 28, 30 and 40 are of the type represented in FIG. 12, comprising a BUTTERWORTH type switched capacitor filter 46 of the 10th order, with a cutoff frequency of 15 Hz, and the voltages at the input and output of the filter 46 are respectively in the order of 3.5 V and 20 microvolts, for an input A.C. voltage having a peak voltage of 220 V and a 50 Hz frequency. To enable correct subsequent processing of the D.C. component, the output of the filter 46 is connected to the input of an amplifier 48, with a gain of 10, having an offset voltage lower than 5 microvolts.

In order to standardize the measuring and servo modules, the production means (D, R) of a D.C. component of the current in a measuring module can be replaced by a power stage of the same type as that of the servo module (FIGS. 9 and 10) controlled from the D.C. component Vc by a servo loop of the same type as the one described with regard to FIG. 9, in which the value of the setpoint Vcons is different from zero. In the case where the power circuit is formed by a triac in series with an inductance, the measuring module then only differs from a servo module in the fact that the setpoint value is not zero and that it comprises in addition a filter 30, designed to be connected to the points A and A', and an electronic processing circuit 32. Naturally if a thyristor is used, the latter is connected in opposite directions depending on whether a measuring module or a servo module is involved.

Figure 13:
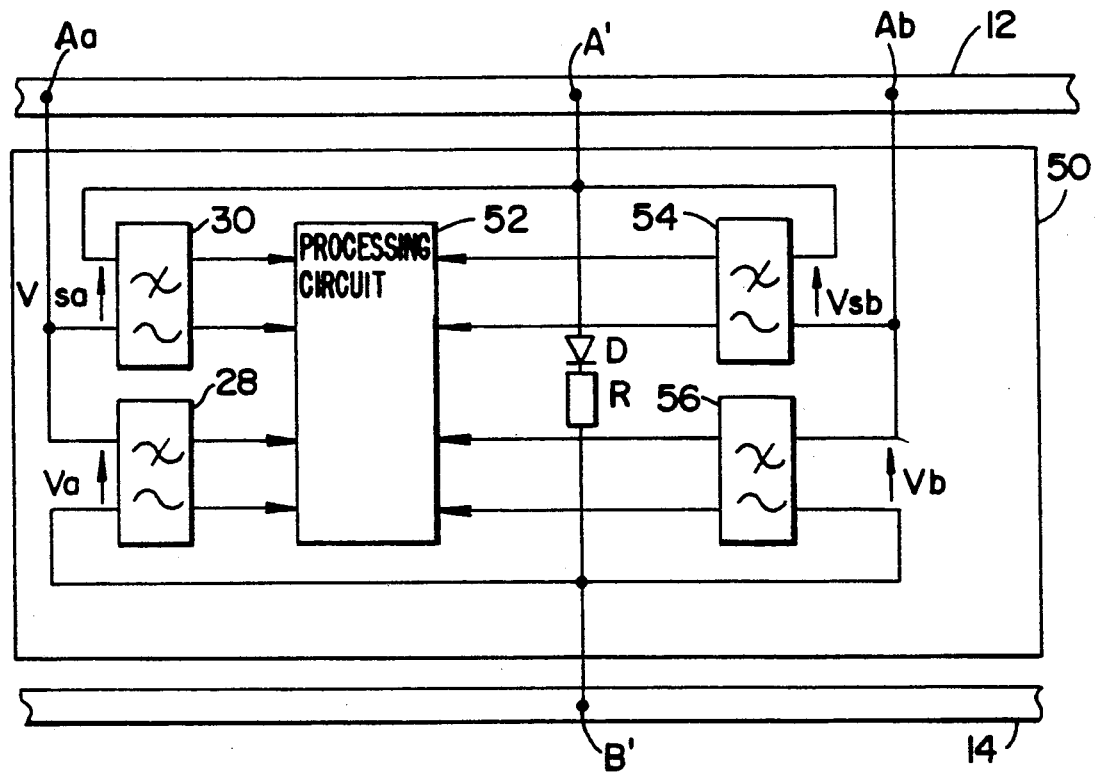
FIG. 13 represents a double measuring module.

The double measuring module 50 according to FIG. 13 enables a line to be monitored simultaneously upline and downline from the module. This module differs from the one represented in FIG. 6 by the fact that it simultaneously measures the voltage at the terminals of two shunt resistors formed by portions of line AaA' and A'Ab, located respectively upline and downline from a point A' of the conductor 12 of the line to be monitored. The voltages Vsa at the terminals of the shunt AaA' and Va at the terminals of the points Aa and B' (possibly between Aa and Ba, Ba being located facing Aa on the conductor 14) are filtered respectively by filters 30 and 28, and their D.C. components obtained at the output of the filters are applied to the inputs of a processing circuit 52. Similarly the voltages Vsb at the terminals of the shunt A'Ab and Vb at the terminals of the points Ab and B', are filtered by filters 54 and 56 and applied to the processing circuit 52. This circuit processes in parallel, in a similar way to the circuit 32 of the module 18, the information relating to the portions of line located respectively upline and downline from the points A' and B'.

Figure 14:
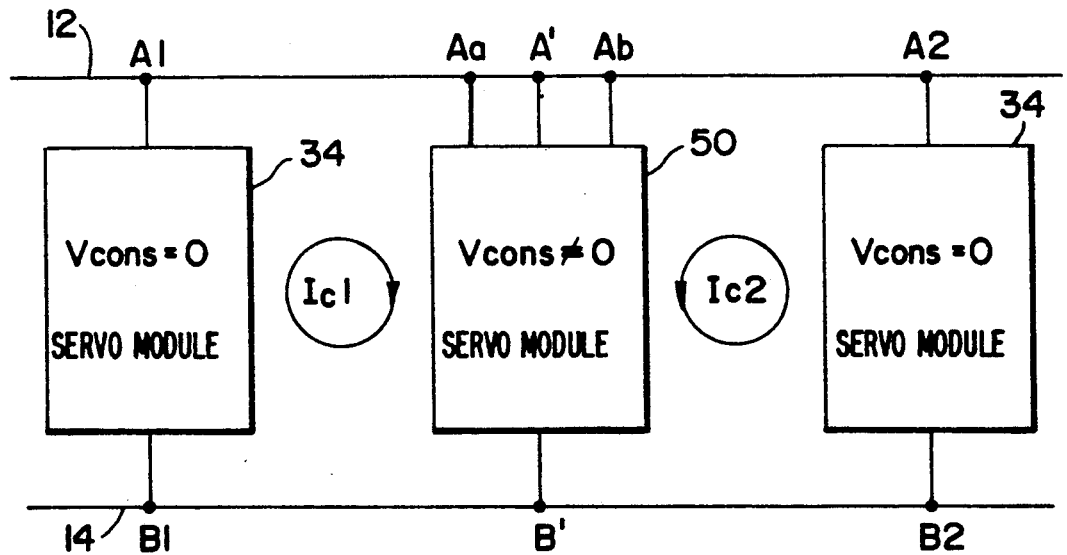
FIGS. 14 and 15 respectively represent the application of the invention to a line and to the tree structure of a mains system in a low voltage switchboard.

The use of a module 50 in combination with two servo modules 34 connected respectively upline (A1B1) and downline (A2B2) from the points A' and B' on a long line is schematized in FIG. 14. It is thus possible to monitor simultaneously the portions of mains system A1Aa/B1B' (direct current Ic1) and AbA2/B'B2 (direct current Ic2). The measuring 50 and servo modules 34 represented in FIG. 14 are standardized and use the same type of servoed power stage, the setpoint voltage being zero for the servo modules and not zero for the measuring module.

The system described above is suitable for monitoring the conduction of mains systems of any structure. As an example, FIG. 15 illustrates a tree-structured mains system, such as is encountered in low voltage switchboards and the module arrangement enabling the whole mains system to be monitored.

Figure 15:
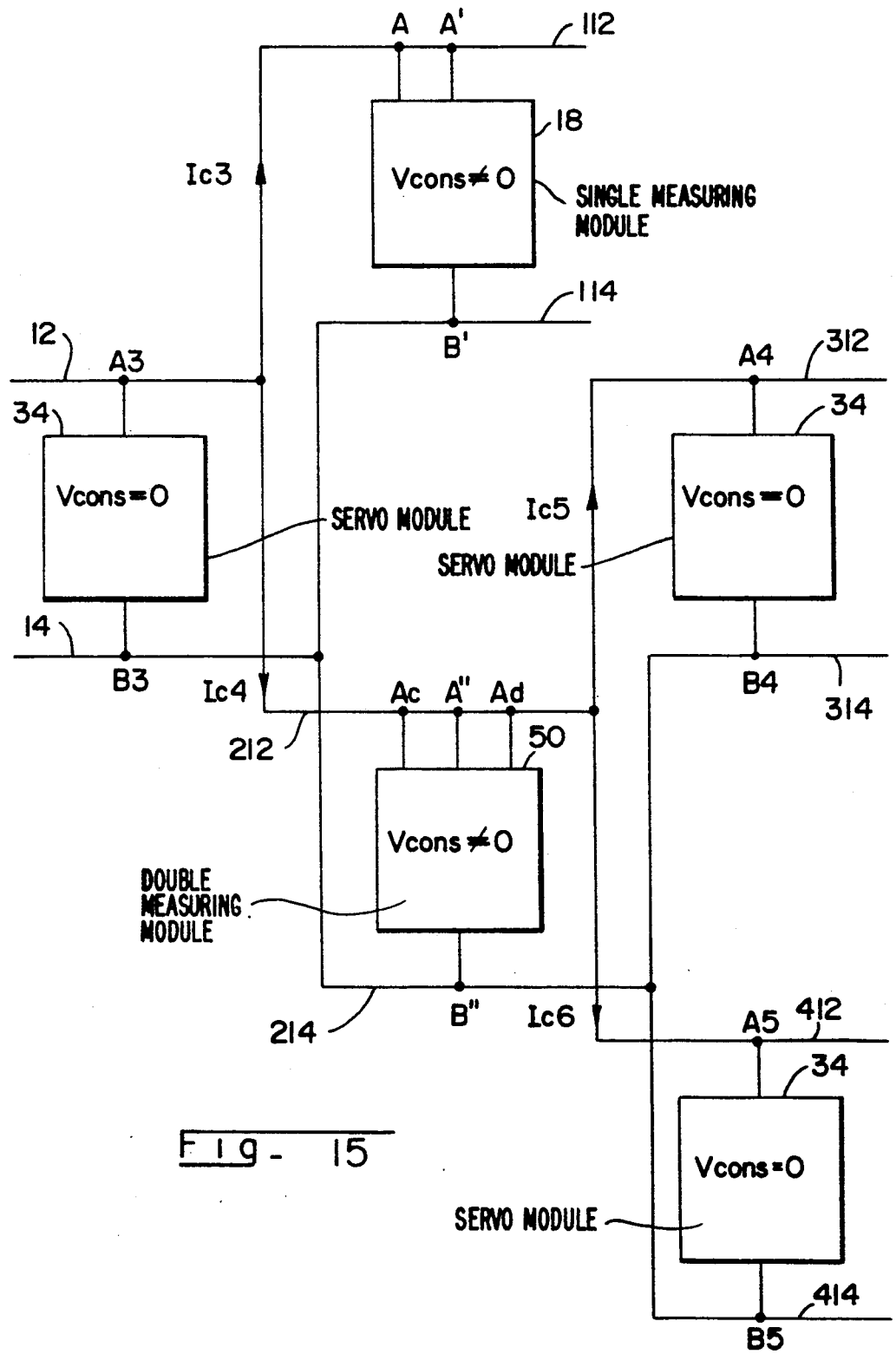

In FIG. 15, the conductors (or bars) 12 and 14 are connected to conductors 112, 212 and, respectively 114, 214, the conductors 212 and 214 being connected to conductors 312, 412 and, respectively 314, 414. A first servo module 34 is connected between points A3 and B3 of the conductors 12 and 14. A measuring module 18 is connected to points A and A' of the conductor 112 and B' of the conductor 114. A double measuring module 50 is connected to points Ac, A" and Ad of the conductor 212 and B" of the conductor 214. A second servo module 34 is connected to points A4 and B4 of the conductors 312 and 314, a third servo module being connected to points A5 and B5 of the conductors 412 and 414. This set of modules therefore enables the conduction of the portions of line A3A/B3B' (direct current Ic3 in the shunt AA'), A3Ac/B3B" (direct current Ic4 in the shunt AcA"), AdA4/B"B4 and AdA5/B"B5 (direct current Ic5 + Ic6 in the shunt A"Ad) to be monitored simultaneously.

The system described above is applicable not only to a single-phase mains system but also to a three-phase mains system. In this case a first measuring module is connected between a first and second phase conductors, a second measuring module being connected between the second and third phase conductors, and possibly a third measuring module between the third phase conductor and a neutral conductor. The three measuring modules may be grouped together in an assembly comprising a single processing circuit. The servo modules are disposed in the same way and conduction of all the conductors can thus be monitored.

Figure 16:
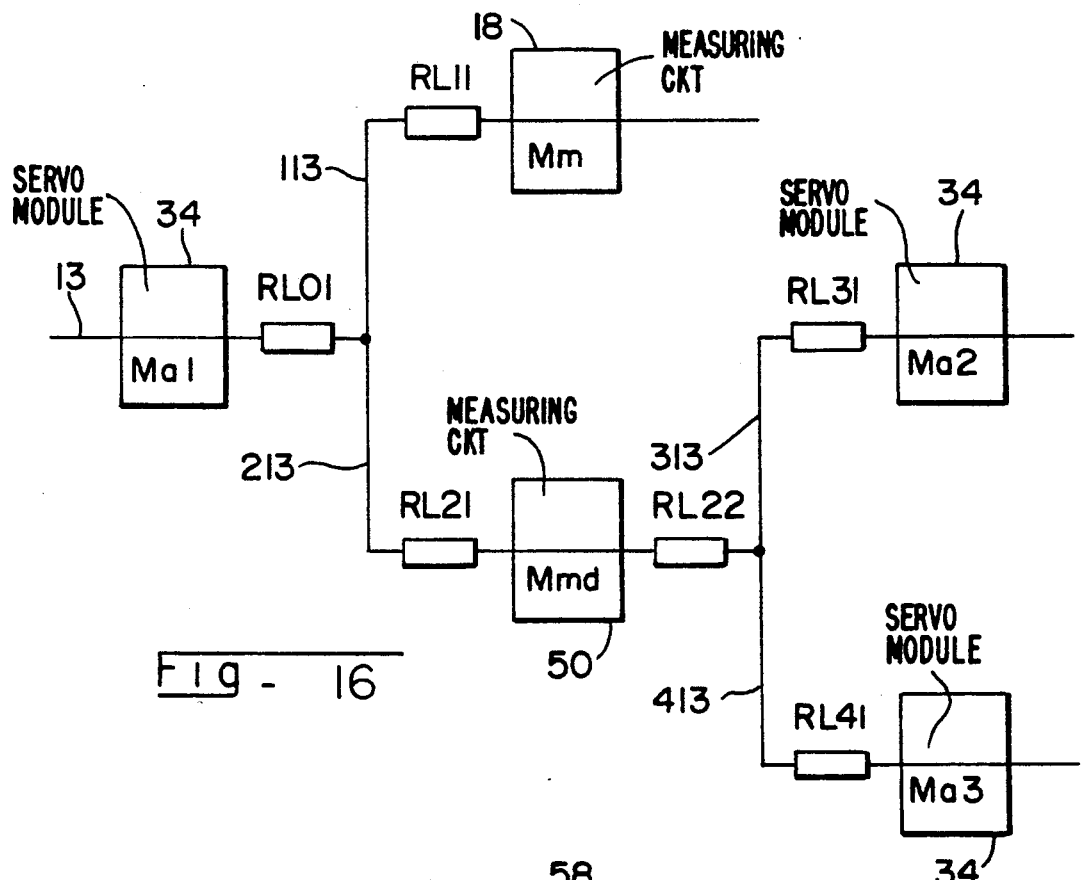
FIG. 16 is a simplified diagram of FIG. 15.

As indicated above, the system described in FIG. 15 enables portions of line comprised between a servo module (34) and a single (18) or double measuring module (50) to be monitored. This monitoring may, in certain cases, be insufficient. FIG. 16 represents, in even more schematic form, the tree-structured system of FIG. 15. In this figure, the two conductors of a portion of line are schematized by a single wire 13 for the conductors 12 and 14, 113 for the conductors 112 and 114, 213 for the conductors 212 and 214, 313 for the conductors 312 and 314 and 413 for the conductors 412 and 414. The servo modules 34 (Ma1, Ma2, Ma3) and single 18 (Mm) or double 50 (Mmd) measuring modules are schematized at the same locations as in FIG. 15. FIG. 16 represents in addition the line resistances of the various portions of line : RL01 for the portion of the main line 13 located downline from the first servo module, RL11 for the portion of the terminal line 113 located upline from the single measuring module (Mm), RL21 for the portion of the intermediate line 213 located upline from the double measuring module (Mmd), RL22 for the portion of the intermediate line 213 located downline from the double measuring module (Mmd), RL31 for the portion of the terminal line 313 located upline from the servo module Ma2, and RL41 for the portion of the terminal line 413 located upline from the servo module Ma3. The arrangement represented in FIGS. 15 and 16 enables the line resistances RL01 + RL11, RL01 + RL21, RL22 + RL31 and RL22 + RL41 to be monitored separately. However, the resistance RL01 is generally much lower than the resistances RL11 and RL21. Likewise, the resistance RL22 is much lower than the resistances RL31 and RL41. As an example, the resistance RL01 can be in the order of 100 microhms, whereas the resistances RL31 and RL41 are in the order of ten milliohms. With the arrangement described, a variation of RL01 or of RL22, very low with respect to the line resistance monitored (RL01 + RL11 or RL01 + RL21 for example), is very difficult to detect.

According to a development of the invention illustrated in FIGS. 17 and 18, it is possible to monitor separately, with the same accuracy, the line resistance (RL01, RL11, RL23 = RL21 + RL22, RL31, RL41) of each portion of line of a tree-structured mains system with a single servo module Ma, located on the main line (13) at the upline end of the mains system to be monitored and a measuring module 58 (Mm1, Mm2, Mm3, Mmi) at the downline end of each terminal line (113, 313, 413) to be monitored. The measuring modules are connected, preferably via a bus 60, to a central processing unit 62.

The servo module (Ma) in FIG. 17 is a module of the type described previously. The measuring modules (Mm1, Mm2, Mm3, Mmi) are, however, modified in the manner described below with respect to FIG. 18.

The measuring module 58 according to FIG. 18 comprises, like the module illustrated in FIG. 6, terminals 20 and 22 designed to be connected to points A and B of the mains system conductors 12 and 14. The terminals 20 and 22 are connected to the inputs of a low-pass filter 28 whose output signals represent the D.C. component of the voltage V.

The module 58 also comprises a power stage designed to impose a D.C. current component between the points A and B. This power stage must be able to be monitored, so as to make this D.C. component flow only during periods determined by the central processing unit 62. The power stage may be of the thyristor and resistor R1 type represented in FIG. 9. In the preferred embodiment in FIG. 18, the power stage is formed by a triac Tr connected in series with a resistor L between the terminals 20 and 22 of the module. A regulator 64 controls conduction of the triac so as to impose a preset D.C. component Ic ref. The regulator 64 receives a signal representative of the current Ic flowing in the triac, measured for example by means of a shunt resistor Rsl, of very low value, in series with the power stage. The shunt resistor Rsl being very weak, for example in the order of 0.1 ohm, it does not cancel the advantages of the nondissipative power stage.

The value Ic ref of the D.C current component being constant, imposed by the regulator, it is not necessary to apply signals representative of this D.C. component to the processing circuit. The variation of the D.C component of the voltage V is then representative of a variation of the line resistance. Consequently, the processing circuit 66 is connected to the output of the filter 28. The processing circuit 66 and the regulator 64 are connected to the central processing unit 62, preferably by means of a bus 60 connected to a communication terminal of the measuring module 58.

The central processing unit 62 monitors, via the bus 60 and regulators 64 of the measuring modules Mmi, sequential activation of the power stages of the different measuring modules (Mm1, Mm2, Mm3, FIG. 17), a single power stage being active at a given moment. The processing circuits 66 of the different modules Mmi continuously monitor the D.C. component of the corresponding voltage V and communicate these values, or their variations, to the central processing unit. The latter can deduce therefrom quantities representative of the individual values of the line resistances of all the portions of mains system line. In this system, monitoring of the variation of the values representative of the line resistances, their comparison with an appropriate threshold and fault indication are performed at the central processing unit level, and not at measuring module processing circuit level.

The table below indicates the line resistances corresponding to the measurements performed by the various measuring modules in FIG. 17 depending on the modules whose power stages are activated :

|  | Module whose power stage is activated | | |
| --- | --- | --- | --- |
|  | Mm1 | Mm2 | Mm3 |
| Measuring module | | | |
| Mm1 | RL01 + RL11 | RL01 | RL01 |
| Mm2 | RL01 | RL01 + RL23 + RL31 | RL01 + RL23 |
| Mm3 | RL01 | RL01 + RL23 | RL01 + RL23 + RL41 |

Thus a fault on the main line (13) is detected both by the modules Mm2 and Mm3 when the module Mm1 is activated and by the module Mm1 when one of the other modules is activated. The resistance RL01 being much lower than RL11, a fault on the terminal line 113 is detected by the module Mm1 when it is activated, whereas a fault on one of the terminal lines 313 and 413 is detected respectively by the modules Mm2 and Mm3 when they are activated. The modules Mm2 and Mm3 both detect a fault on the intermediate line 213, respectively when the modules Mm3 and Mm2 are activated.

These different measurements are transmitted to the central processing unit 62 which compares their variations to appropriate thresholds, so as to obtain the same sensitivity for all faults, and to detect and rapidly locate a fault on any one of the portions of the mains system.

It results from the above table that a fault on the main line is detected whatever the measuring module activated, whereas a fault on a terminal line is only detected when the measuring module associated with this line is activated. Thus, the measuring frequency is proportional to the importance of the line.

A measuring sequence preferably also comprises a measuring phase during which no measuring module being activated, the offset voltages of the different modules are measured.

We claim:

1. A measuring system of the line resistance of an electrical mains system comprising first and second conductors fed by an A.C. voltage source, said measuring system comprising:

at least one measuring module including means for producing a D.C. current component Ic between first and second points (A,B) situated, respectively, on the first and second conductors, measuring means for measuring a voltage (V) applied between said first and second points (A,B) an extraction filter for extracting a D.C. component of said measured voltage (V), and a processing circuit coupled to an output of the extraction filter, said processing circuit comprising computation means for computing a value representative of a line resistance (RL) of a portion of the mains system, detection means for detecting a variation of said line resistance value (RL), comparison means for comparing said variation with a preset threshold (s1), and indication means for indicating a conduction fault when said variation exceeds said threshold.

2. The system according to claim 1, wherein the measuring module further comprises: a measuring resistor (R) through which said D.C. current component Ic flows, means for determining the voltage (Vr) at the terminals of the measuring resistor, and extractor filter means for extracting the D.C. component of said measured voltage (Vr), wherein said value representative of the line resistance (RL), computed by the processing circuit, is proportional to a ratio of the respective D.C. components of the voltages measured between said first and second points (A,B) and at the terminals of said measuring resistor (R).

3. The system according to claim 1, wherein said means for producing the D.C. current is connected between said second point (B) and a third point (A') of the first conductor adjacent to the first point (A) so as to provide between the first and third points a shunt resistor (Rs) positioned on a contact-free portion (AA', AaA', A'Ab) of the first conductor, the measuring module comprising measuring means for measuring the voltage (Vs,Vsa,Vsb) at the terminals of the shunt resistor (Rs), and extraction filter means for extracting the D.C. component of the voltage at the terminals of the shunt resistor (Rs), the value representative of the line resistance (RL) computed by the processing circuit being proportional to the ratio of the D.C. components of the voltages, (V,Vs) measured, respectively, between said first and second points (A,B) and at the terminals of the shunt resistor (Rs).

4. The system according to claim 1, further comprising at least one loop module comprising input terminals connected to fourth and fifth points (A1,B1) situated, respectively, on the first and second main system conductors, and means for providing feedback looping of said D.C. current component, said value representative of the line resistance (RL), computed by the measuring module processing circuit, being the line resistance of the portion of mains system comprised between the measuring and loop modules.

5. The system according to claim 4, wherein the loop module is a servo module comprising means for regulating the D.C. component of the voltage applied between said input terminals to zero.

6. The system according to claim 1, further comprising:
a double measuring module connected to said second point (B1) and to sixth, seventh and eighth points (AA, A', AB) of the first conductor, said sixth, seventh, and eighth points being positioned such that two shunt resistors are located between then on two adjacent contact-free portion (AaA', A'Ab) of the first conductor, and means for producing the D.C. current component of the double measuring module being connected between said second and seventh points (B1, A'), the double measuring module comprising means for measuring the voltages at the terminals of the two shunt resistances, means for measuring the voltages applied between the second (B1) and, respectively, the sixth (Aa) or eighth (Ab) points, and extraction filter means for extracting the D.C. components of said voltages;

a first servo module connected upline from the double measuring module and a second servo module connected downline from the double measuring module, each servo module comprising means for providing feedback looping of the D.C. current component and means of regulating the D.C. component of the voltage applied between input terminals of the servo module to zero;
wherein a processing circuit of the double measuring module computes the values representative of the line resistances of the two portions of mains system comprised between the double measuring module and the two associated servo modules.

7. The system according to claim 5, wherein the servo module comprises a low-pass filter whose inputs are connected to the input terminals of the servo module, the output of the filter being connected to a first input of a regulator a second input of which receives a zero setpoint value, the output of the regulator being applied to the input of a control circuit whose output is connected to a control electrode of a controlled rectifier connected between the input terminals of the servo module and providing looping of the D.C. current component.

8. The system according to claim 1, wherein the means for producing a D.C. current component comprises a controlled rectifier that receives control signals from a regulator coupled thereto.

9. The system according to claim 8, further comprising a central processing unit connected to each measuring module so as to control triggering of the controlled rectifier of each measuring module.

10. The system according to claim 9, wherein the mains system comprises a plurality of branches and wherein the measuring system further comprises a servo module located upline from the portion of mains system to be monitored and a measuring module connected downline from each of the terminal branches of the mains system to be monitored, the central processing unit controlling the sequential triggering of the controlled rectifiers of the measuring modules and continuously receiving from the different measuring modules a value representative of the D.C. component of the voltage at the terminals of each measuring module, wherein the central processing unit comprises means for computing the values representative of the line resistance of the various portions of mains system, detection means for detecting a variation of said values, comparison means for comparing said variations with preset respective thresholds, and indication means for indicating a conduction fault in one of said portions when the variation of the value associated with said portion exceeds the corresponding threshold.

* * * * *